US009645542B2

(12) United States Patent
Fukuda et al.

(10) Patent No.: US 9,645,542 B2
(45) Date of Patent: May 9, 2017

(54) ELECTRIC APPARATUS

(71) Applicant: KYOCERA Document Solutions Inc., Osaka (JP)

(72) Inventors: Motoyuki Fukuda, Osaka (JP); Hiroyuki Tanaka, Osaka (JP); Tetsuya Ichiguchi, Osaka (JP)

(73) Assignee: KYOCERA Document Solutions Inc., Osaka (JP)

(*) Notice: Subject to any disclaimer, the term of this patent is extended or adjusted under 35 U.S.C. 154(b) by 0 days.

(21) Appl. No.: 15/302,393

(22) PCT Filed: Oct. 30, 2015

(86) PCT No.: PCT/JP2015/080747
§ 371 (c)(1),
(2) Date: Oct. 6, 2016

(87) PCT Pub. No.: WO2016/113982
PCT Pub. Date: Jul. 21, 2016

(65) Prior Publication Data
US 2017/0031300 A1    Feb. 2, 2017

(30) Foreign Application Priority Data

Jan. 13, 2015   (JP) .................. 2015-004014

(51) Int. Cl.
*G03G 15/00*     (2006.01)
*H01R 13/58*    (2006.01)
(Continued)

(52) U.S. Cl.
CPC .............. *G03G 15/80* (2013.01); *B41J 23/32* (2013.01); *B41J 29/00* (2013.01); *B41J 29/13* (2013.01);
(Continued)

(58) Field of Classification Search
CPC ........ G03G 15/80; H01R 13/58; H01R 13/73; H01R 24/66; B41J 29/13
See application file for complete search history.

(56) References Cited

U.S. PATENT DOCUMENTS

| 2,536,776 | A | * | 1/1951 | Smellie | ................. A47J 37/08 15/323 |
| D312,521 | S | * | 11/1990 | Vildosola | ...................... D32/73 |
| 6,705,890 | B2 | * | 3/2004 | Kitou | .................... H01R 13/72 439/160 |
| 7,454,852 | B2 | * | 11/2008 | Giovalle | ................ D06F 75/28 248/52 |

(Continued)

FOREIGN PATENT DOCUMENTS

| JP | H 4-199157 A | 7/1992 |
| JP | 2007-35795 A | 2/2007 |

OTHER PUBLICATIONS

International Search Report dated Dec. 15, 2015, issued to International Application No. PCT/JP2015/080747.
(Continued)

*Primary Examiner* — Briggitte R Hammond
(74) *Attorney, Agent, or Firm* — Stein IP, LLC

(57) ABSTRACT

An electric apparatus includes a power cord having first and second plug portions, and a cord portion, a plug insertion recessed portion, and a cord housing groove. The plug insertion recessed portion has an insertion surface that is formed at a position recessed inward from a side surface, and to which an inlet is attached, a first slope extending from a lower end part of the insertion surface, and a second slope extending from an upper end part of the insertion surface. In a state where the first plug part has been inserted in the inlet, a distance a from a lower end part of the first plug portion to the lower edge of the plug insertion recessed portion and a distance b from an upper end part of the first plug portion to the upper edge of the plug insertion recessed portion satisfy a relationship of a>b.

11 Claims, 8 Drawing Sheets

(51) Int. Cl.
  *H01R 24/66* (2011.01)
  *B41J 23/32* (2006.01)
  *B41J 29/00* (2006.01)
  *H04N 1/00* (2006.01)
  *H05K 7/00* (2006.01)
  *B41J 29/13* (2006.01)
  *B41J 29/393* (2006.01)
  *H01R 24/68* (2011.01)
  *H01R 105/00* (2006.01)
  *H01R 13/453* (2006.01)
  *H01R 24/70* (2011.01)

(52) U.S. Cl.
  CPC ............ *B41J 29/393* (2013.01); *G03G 15/00* (2013.01); *H01R 24/66* (2013.01); *H01R 24/68* (2013.01); *H04N 1/00* (2013.01); *H05K 7/00* (2013.01); *H01R 13/4534* (2013.01); *H01R 13/58* (2013.01); *H01R 24/70* (2013.01); *H01R 2105/00* (2013.01)

(56) References Cited

U.S. PATENT DOCUMENTS

| | | | |
|---|---|---|---|
| 7,467,971 B2* | 12/2008 | Lin | H01R 13/60 |
| | | | 191/12.2 R |
| 8,308,500 B2* | 11/2012 | Davison | H01R 13/6273 |
| | | | 439/345 |
| 8,545,260 B2* | 10/2013 | Zhou | H01R 13/72 |
| | | | 191/12.4 |
| 9,161,464 B2* | 10/2015 | Liao | H05K 5/0065 |
| 2016/0126685 A1* | 5/2016 | Chen | H01R 43/20 |
| | | | 439/284 |

OTHER PUBLICATIONS

Written Opinion of the International Search Authority dated Dec. 15, 2015, issued to International Application No. PCT/JP2015/080747.

\* cited by examiner

ELECTRIC APPARATUS

CROSS-REFERENCE TO RELATED APPLICATIONS

This application is a national stage of International Application No. PCT/JP2015/080747 filed Oct. 30, 2015, which claims the benefit of priority to Japanese Application No. 2015-004014, filed Jan. 13, 2015, in the Japanese Patent Office, the disclosures of which are incorporated herein in their entireties by reference.

TECHNICAL FIELD

The present invention relates to small, desktop-type electric apparatuses as exemplified by image forming apparatuses such as copiers, printers, facsimile machines, and the like, scanners, air purifiers, personal computers, and the like. In particular, the present invention relates to a power cord attachment portion for a power cord for supplying power to an electric apparatus.

BACKGROUND ART

Conventionally, power for operating a small, desktop-type electric apparatus, as exemplified by an image forming apparatus such as a copier, a printer, a facsimile machine, or the like, a scanner, an air purifier, and a personal computer, or the like, is supplied via an outlet, through a power cord, and to a power supply board of the electric apparatus. As for a method for attaching the power cord to the electric apparatus, generally a plug portion of the power cord is attached by being inserted into an inlet of the electric apparatus.

For example, Patent Literature 1 listed below discloses a printer in which a smaller placement space and easy connection of a power cord is achieved by provision of a recessed portion formed in an external wall surface of an apparatus main body, with a connector to which a power cord, a cable, or the like is connected provided on such part of an inner surface of the recessed portion as is substantially perpendicular to the external wall surface.

Patent Literature 2 listed below describes a power cord attachment structure for an apparatus provided with a power cord drawn out from inside a frame body, and characterized in that the frame body has an opening formed therein through which the power cord penetrates, that the opening is disposed at a high position a predetermined distance away from a floor surface, that an engagement portion for fixing the power cord is provided inside the frame body to be spaced from the opening, that such part of the power cord as extends inside the frame body from the engagement portion to the opening is disposed along a side surface inside the frame body, and that such part of the power cord as extends from the opening to outside the frame body is provided to be drawable along a side surface of the frame body.

CITATION LIST

Patent Literature

[Patent Literature 1] JP-A-H04-199157
[Patent Literature 2] JP-A-2007-35795

SUMMARY OF INVENTION

Technical Problem

However, the method of Patent Literature 1 allows dust to easily accumulate in the recessed portion formed in the external wall surface. Thus, if the plug portion of the power supply cord is left inserted in the inlet of an electronic apparatus for a long time, there may be caused an undesirable phenomenon such as tracking, in which dust accumulated in the recessed portion absorbs moisture to cause repeated discharge of sparks between two poles of the plug portion, and degrades the insulation of the plug portion so that electricity flows between the two poles to generate enough heat to catch fire. Furthermore, in a case where there is a wide space above the inlet in the recessed portion, dust accumulates also in a gap between an inner surface of the recessed portion and an upper surface of the inlet. Moreover, in a case where there is a horizontal surface in a bottom surface of the recessed portion, and the electric apparatus is kept without the power cord attached thereto, dust tends to accumulate on the horizontal surface, as well.

On the other hand, with the configuration of Patent Literature 2, although dust is unlikely to accumulate, and it is possible to achieve a space-saving apparatus, since the plug portion of the power cord is inserted upward into the inlet, the power cord sometimes comes off if an external force is accidentally applied to the power cord. Furthermore, inserting the power cord upward from below into the inlet degrades operability, and further, it is difficult to check whether the plug portion is completely inserted in the inlet. In addition to these methods, there is a method where an inlet into which a plug portion is to be inserted is covered with an openable cover, but the method is disadvantageous in that it degrades operability and requires a larger number of components.

In view of the above problems, an object of the present invention is to provide an electric apparatus where a power cord can be easily and securely attached to an apparatus main body and accumulation of dust in a power cord attachment portion can be reduced.

Solution to Problem

To achieve the above object, according to a first aspect of the present invention, an electric apparatus includes a power cord, a plug insertion recessed portion, and a cord housing groove. The power cord has a first plug portion configured to be detachably connected to an apparatus main body, a second plug portion configured to be detachably connected to an external power supply, and a cord portion that connects the first plug portion and the second plug portion to each other. The plug insertion recessed portion is disposed in a side surface of the apparatus main body, and an inlet to which the first plug portion is to be connected is attached to the plug insertion recessed portion. The cord housing groove is formed to communicate with the plug insertion recessed portion, the cord housing groove having a depth equal to or larger than an outer diameter of the cord portion, and a width substantially equal to a width of the cord portion. The plug insertion recessed portion includes an insertion surface that is formed at a position recessed inward from the side surface to be substantially parallel to the side surface and to which the inlet is attached, a first slope extending from a lower end part of the insertion surface toward a lower edge of the plug insertion recessed portion, and a second slope extending from an upper end part of the insertion surface to an upper edge of the plug insertion recessed portion. In a state where the first plug portion is inserted in the inlet, a distance a from a lower end part of the first plug portion to the lower edge of the plug insertion recessed portion and a distance b from an upper end part of the first plug portion to the upper edge of the plug insertion recessed portion satisfy a relationship of a>b.

Advantageous Effects of Invention

According to the first aspect of the present invention, the distance a from the lower end part of the first plug portion to the lower edge of the plug insertion recessed portion is made larger than the distance b from the upper end part of the first plug portion to the upper edge of the plug insertion recessed portion. As a result, a gap between the upper edge of the plug insertion recessed portion and an upper surface of the first plug portion becomes relatively narrow, and this helps make it less likely that dust will collect on the upper surface of the first plug portion. Furthermore, although a space below the first plug portion becomes wider compared with a space above the first plug portion, since the first slope is formed to extend from the lower end part of the first plug portion to an edge of the plug insertion recessed portion, dust is less likely to collect in the space below the first plug portion. Moreover, a finger of a user can be smoothly inserted along the first and second slopes into a gap between the plug insertion recessed portion and the first plug portion.

DESCRIPTION OF EMBODIMENTS

Figure 1:
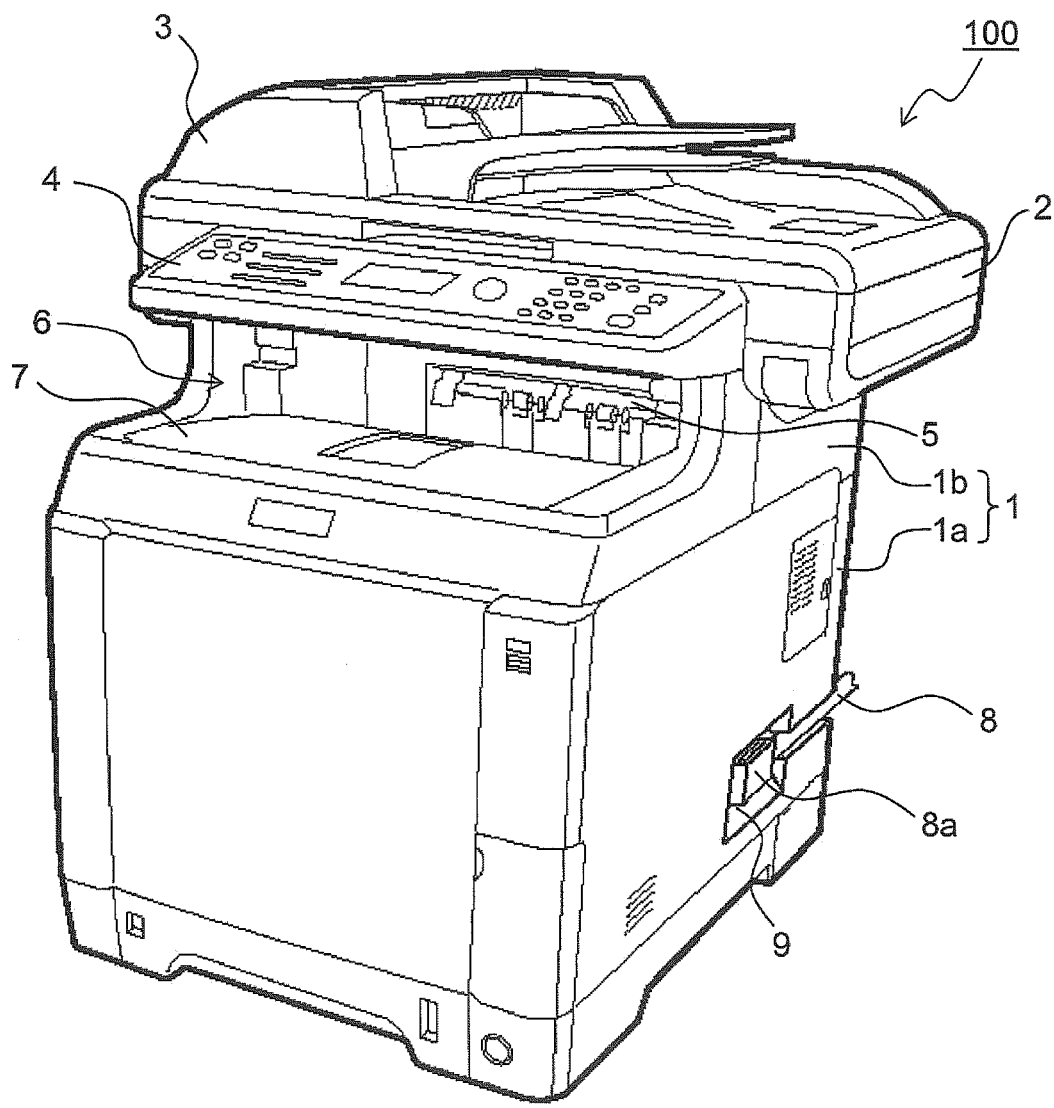
FIG. 1 is an external perspective view of an image forming apparatus 100 according to a first embodiment of the present invention.

Hereinafter, descriptions will be given of embodiments of the present invention with reference to the accompanying drawings. FIG. 1 is an external perspective view of an image forming apparatus 100 according to a first embodiment of the present invention. As illustrated in FIG. 1, the image forming apparatus 100 is a so-called in-body sheet discharge type digital multifunction peripheral (MFP), and broadly includes a main body housing 1 and an upper housing 2 arranged above the main housing.

Provided in the upper housing 2 is an image reading portion for reading an image of a document as an electric signal. On the other hand, the main body housing 1 is provided with later-described various mechanisms for transferring an image to a sheet based on the electric signal obtained by reading the image of the document. On an upper surface of the upper housing 2, there is provided a document feeder 3 that feeds document sheets separately one by one to the image reading portion. In addition, an operation panel 4 is provided and disposed to project from a side surface of the upper housing 2 to a front of the image forming apparatus 100.

The main body housing 1 includes a lower housing 1a and a connection housing 1b that is located above the lower housing 1a to lie along a rear surface part of the lower housing 1a, and connected to the upper housing 2. The lower housing 1a is provided with a sheet feeding portion, an image forming portion that forms a toner image on a sheet P, a fixing device for fixing a toner image formed on a sheet, etc. (none of which is illustrated). On the other hand, the connection housing 1b is provided with a sheet discharge portion 5 for conveying a sheet that has undergone fixing, and discharging the sheet from the main body housing 1.

Furthermore, in front of the connection housing 1b, directly under the upper housing 2, there is formed an in-body sheet discharge space 6 that is widely opened toward the front. In the in-body sheet discharge space 6, there is provided a sheet discharge tray 7 that receives sheets discharged via the sheet discharge portion 5 of the connection housing 1b to be stacked on the sheet discharge tray 7.

In a lower part of a right side surface of the lower housing 1a, there is formed a plug insertion recessed portion 9 where a plug portion 8a of a power cord 8 is inserted. Power is supplied to the image forming apparatus 100 from the power cord 8 via the plug insertion recessed portion 9. In addition, inside the image forming apparatus 100, there is provided an exhaust fan (not shown) that discharges air heated by heat discharged from the fixing device, etc. Air inside the image forming apparatus 100 is discharged to outside by the exhaust fan through an exhaust duct (not shown) provided on a left side surface of the lower housing 1a.

Figure 2:
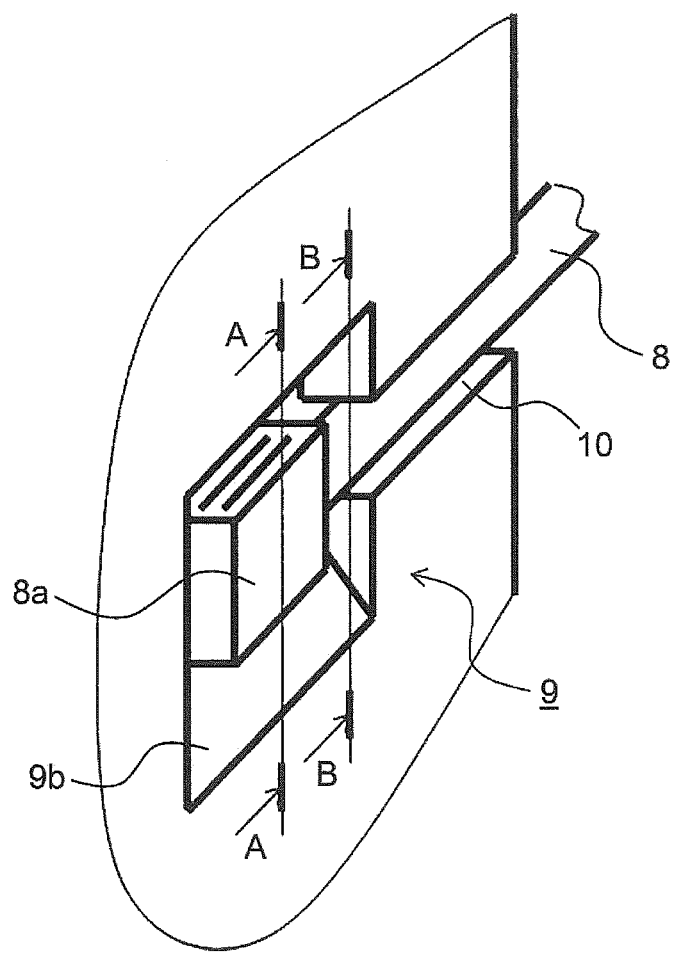
FIG. 2 is an enlarged perspective view of a plug insertion recessed portion 9 illustrated in FIG. 1.
Figure 3:
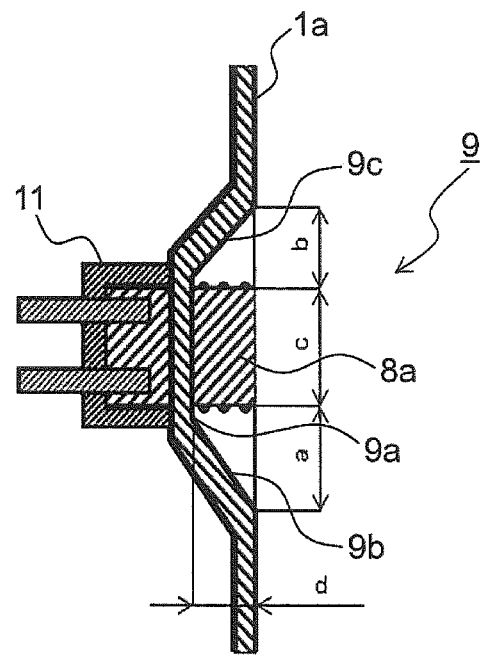
FIG. 3 is a sectional view of the plug insertion recessed portion 9.
Figure 4:
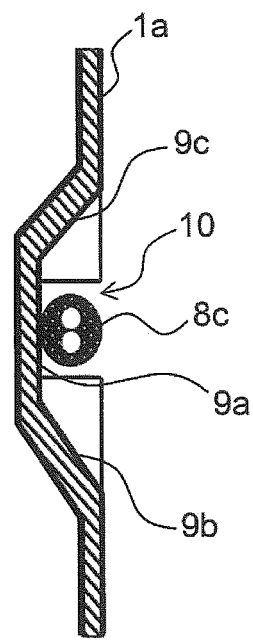
FIG. 4 is a sectional view of the plug insertion recessed portion 9 taken at a position different from in FIG. 3.
Figure 5:
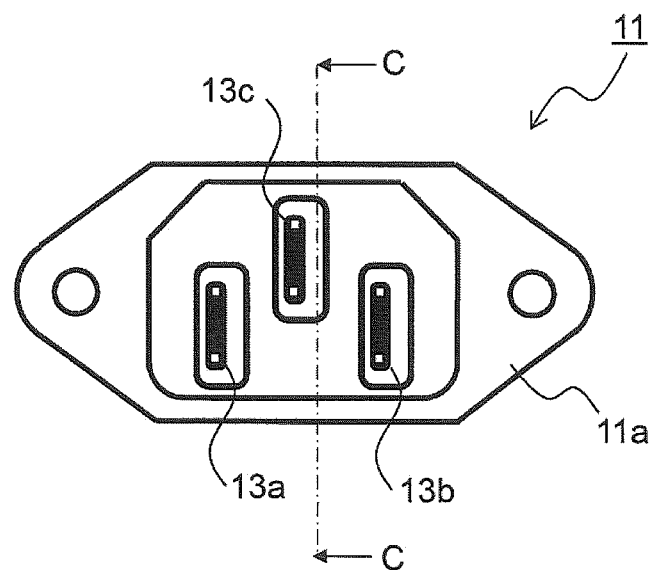
FIG. 5 is a diagram illustrating an inlet 11 to be attached to the plug insertion recessed portion 9, as seen from a terminals-13a-to-13c side.
Figure 6:
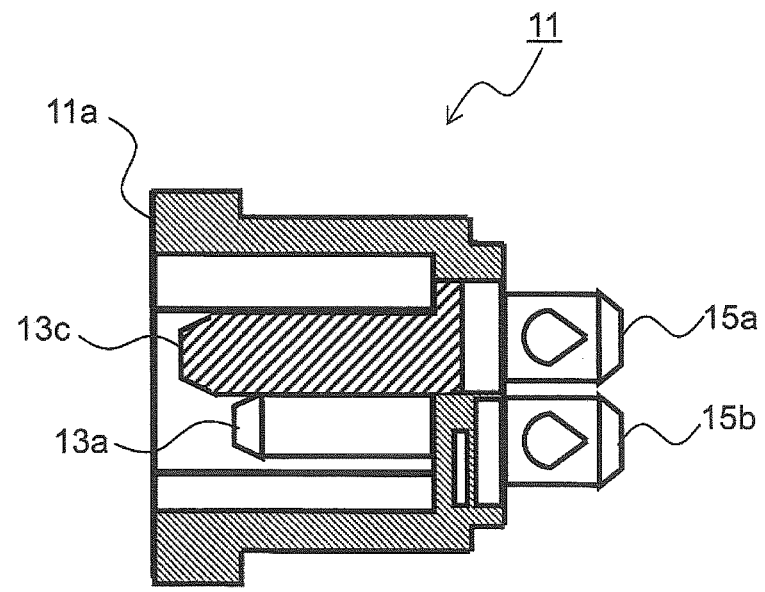
FIG. 6 is a side sectional view of the inlet 11.
Figure 7:
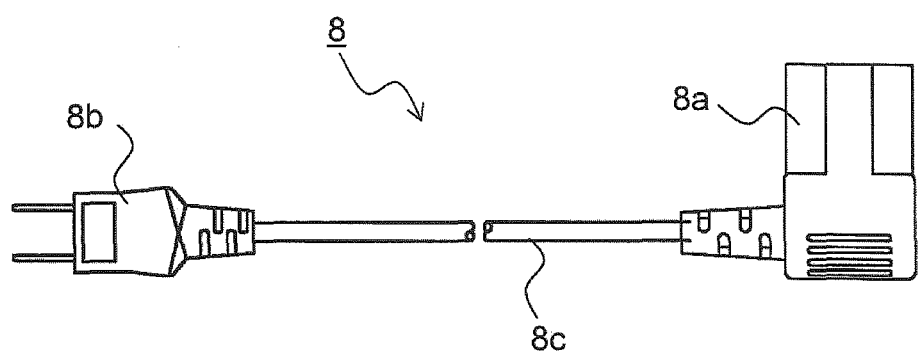
FIG. 7 is an overall view of a power cord 8.
Figure 8:
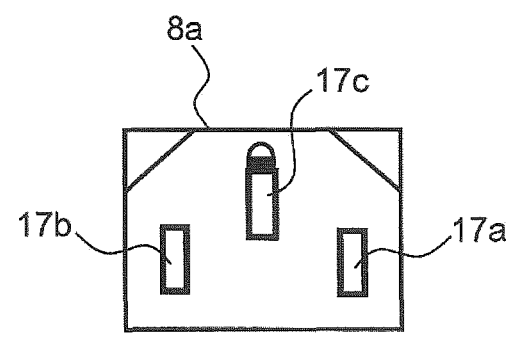
FIG. 8 is a diagram illustrating a first plug portion 8a of the power cord 8, as seen from a terminal-holes-17a-to-17c side.

FIG. 2 is an enlarged view of the plug insertion recessed portion 9 illustrated in FIG. 1, FIG. 3 is a sectional view (taken along line AA of FIG. 2) of the plug insertion recessed portion 9, FIG. 4 is a sectional view (taken along line BB of FIG. 2) of the plug insertion recessed portion 9 taken at a position different from in FIG. 3, FIG. 5 is a diagram illustrating an inlet 11 to be attached to the plug insertion recessed portion 9, as seen from a terminals-13a-to-13c side, FIG. 6 is a side sectional view (taken along line CC of FIG. 5) of the inlet 11, FIG. 7 is an overall view of the power cord 8, FIG. 8 is a diagram illustrating a first plug portion 8a of the power cord 8, as seen from a terminal-holes-17a-to-17c side.

As illustrated in FIG. 2 and FIG. 3, the plug insertion recessed portion 9 has an insertion surface 9a located at a position recessed inward from a side surface of the lower housing 1a, a first slope 9b extending from a lower end part of the insertion surface 9a toward a lower edge of the plug insertion recessed portion 9, and a second slope 9c extending from an upper end part of the insertion surface 9a toward an upper edge of the plug insertion recessed portion 9. On the insertion surface 9a, there is provided an inlet 11 into which the first plug portion 8a of the power cord 8 is inserted.

As illustrated in FIG. 2 and FIG. 4, a cord housing groove 10 communicates with the plug insertion recessed portion 9, the cord housing groove 10 extending in a direction toward a rear surface of the image forming apparatus 100, and a cord portion 8c of the power cord 8 is housed in the cord housing groove 10. A depth of the cord housing groove 10 is the same as a depth of the plug insertion recessed portion 9, but is a little larger than a depth of an outer diameter of the cord portion 8c. Further, a width of the cord housing groove 10 is substantially the same as an outer diameter of the cord portion 8c. As a result, when in use, the cord housing groove 10 is filled up with the cord portion 8c. For example, when the image forming apparatus 100 is used with the right side surface of the image forming apparatus 100, where the plug insertion recessed portion 9 and the cord housing groove 10 are formed, in direct contact with a wall surface, it is possible to reduce entry of dust into the plug insertion recessed portion 9 through the cord housing groove 10.

As illustrated in FIG. 5 and FIG. 6, a main body portion 11a of the inlet 11 is U-shaped in section, and electrode terminals 13a and 13b and a ground terminal 13c projects to an inside of the main body portion 11a. On a rear surface side of the main body portion 11a, there projects board-side terminals 15a and 15b which are to be connected to a power supply board (not shown).

As illustrated in FIG. 7, the power cord 8 includes the first plug portion 8a that is to be inserted into the inlet 11 disposed in the insertion surface 9a, a second plug portion 8b that is to be inserted into a 100-V power supply (an outlet), and the cord portion 8c that connects the first plug portion 8a and the second plug portion 8b to each other.

As shown in FIG. 8, the first plug portion 8a is a three-terminal L-shaped plug with a ground terminal, the first plug portion 8a having electrode terminal holes 17a and 17b into which the electrode terminals 13a and 13b of the inlet 11 are to be inserted, and a ground terminal hole 17c into which the ground terminal 13c of the inlet 11 is to be inserted. The second plug portion 8b is a two-terminal plug without a ground terminal.

In the present embodiment, an up-down direction dimension of an opening of the plug insertion recessed portion 9 (the distance from a lower edge of the first slope 9b to an upper edge of the second slope 9c, the distance of a+b+c in FIG. 3) is set to be equal to or larger than three times, but equal to or smaller than four times, of an up-down direction dimension of the first plug portion 8a (the distance c in FIG. 3). Specifically, the up-down direction dimension of the first plug portion 8a is 15 mm, and thus the up-down direction dimension of the opening of the plug insertion recessed portion 9 is set to 45 mm.

When the first plug portion 8a has been inserted in the inlet 11, the distance a from a lower end part of the first plug portion 8a to the lower edge of the plug insertion recessed portion 9 and the distance b from an upper end part of the first plug portion 8a to the upper edge of the plug insertion recessed portion 9 (see FIG. 3 for the two distances) satisfy a relationship of a>b. Further, the distance a is set to be equal to or larger than 1.1 times, but equal to or smaller than 1.4 times, of the up-down direction dimension of the first plug portion 8a, and the distance b is set to be equal to or larger than 0.8 times of the up-down direction dimension of the first plug portion 8a, but is equal to or smaller than the up-down direction dimension of the first plug portion 8a. Specifically, the distance a is set to 17.5 mm, and the distance b is set to 12.5 mm.

With this configuration, the distance b from the upper end part of the first plug portion 8a to the upper edge of the plug insertion recessed portion 9 becomes a distance suitable for a user to put his/her index finger on the upper end part of the first plug portion 8a, and the distance a from the lower end part of the first plug portion 8a to the lower edge of the plug insertion recessed portion 9 becomes a distance suitable for the user to put his/her thumb on the lower end part of the first plug portion 8a. That is, the spaces above and below the first plug portion 8a are such that the distances a and b are minimum distances necessary in detaching the first plug portion 8a. Moreover, the user can insert his/her fingers into the gaps between the plug insertion recessed portion 9 and the first plug portion 8a smoothly along the first slope 9b and the second slope 9c.

Further, the narrow space between the upper edge of the plug insertion recessed portion 9 and the upper surface of the first plug portion 8a makes dust unlikely to accumulate on the upper surface of the first plug portion 8a. Note that although the space below the first plug portion 8a is larger than the space thereabove, since the first slope 9b is formed to extend from the lower end part of the first plug portion 8a to the lower edge of the plug insertion recessed portion 9, it is unlikely that dust will accumulate in this space. Moreover, even if dust accumulates in this area from the lower end part of the first plug portion 8a to the lower edge of the plug insertion recessed portion 9, since the first slope 9b is inclined at a steep angle (50° or more, for example), the dust accumulated in the area will fall down.

Further, in the present embodiment, an up-down direction dimension of the insertion surface 9a where the inlet 11 is disposed is set to be equal to or larger than 1.2 times, but equal to or smaller than 1.5 times, of the up-down direction dimension of the first plug portion 8a. Specifically, the up-down direction dimension of the first plug 8a is 15 mm, and thus the up-down direction dimension of the insertion surface 9a is set to 20 mm.

With this configuration, in inserting the first plug portion 8a into the inlet 11, by pushing the first plug portion 8a into contact with the insertion surface 9a, the electrode terminals 13a and 13b and the ground terminal 13c of the inlet 11 can be securely inserted in the electrode terminal holes 17a and 17b and the ground terminal hole 17c of the first plug portion 8a completely to their base ends (roots). This helps prevent the first plug portion 8a from coming out.

Further, a distance d (see FIG. 3) from the insertion surface 9a to a side surface of the lower housing 1a, which is, in other words, a depth of the plug insertion recessed portion 9, is of a dimension substantially equal to a dimension of the first plug portion 8a in its width direction (a right-left direction in FIG. 3) (here, 25 mm). With this configuration, in a state where the first plug portion 8a has been inserted in the inlet 11, a rear surface of the first plug portion 8a is flush with the side surface of the lower housing 1a. Thus, the first plug 8a neither projects from the side surface of the lower housing 1a nor sinks deep in the plug insertion recessed portion 9, and this helps save an apparatus placement space, and also makes it easy to attach/detach the first plug portion 8a.

Further, by housing the cord portion 8c of the power cord 8 along the cord housing groove 10, the power cord 8 can be connected in such a manner that the first plug portion 8a and the cord portion 8c do not project from the side surface of the lower housing 1a. Thereby, it is possible to place the image forming apparatus 100 with the side surface of the lower housing 1a, where the plug insertion recessed portion 9 is formed, in direct contact with a wall surface of a place where it is placed, and thus to reduce entry of dust into the plug insertion recessed portion 9.

Further, since an exhaust duct is formed in a side surface (the left side surface) on a side opposite to the side surface (the right side surface of the lower housing 1a) where the plug insertion recessed portion 9 is formed, the exhaust duct from which dust comes does not exist in the vicinity of the plug insertion recessed portion 9, and this helps reduce accumulation of dust in the plug insertion recessed portion 9. Moreover, there is no possibility for the exhaust duct to be covered up when the side surface of the lower housing 1a in which the plug insertion recessed portion 9 is formed is placed in direct contact with a wall surface of the apparatus placement space.

Figure 9:
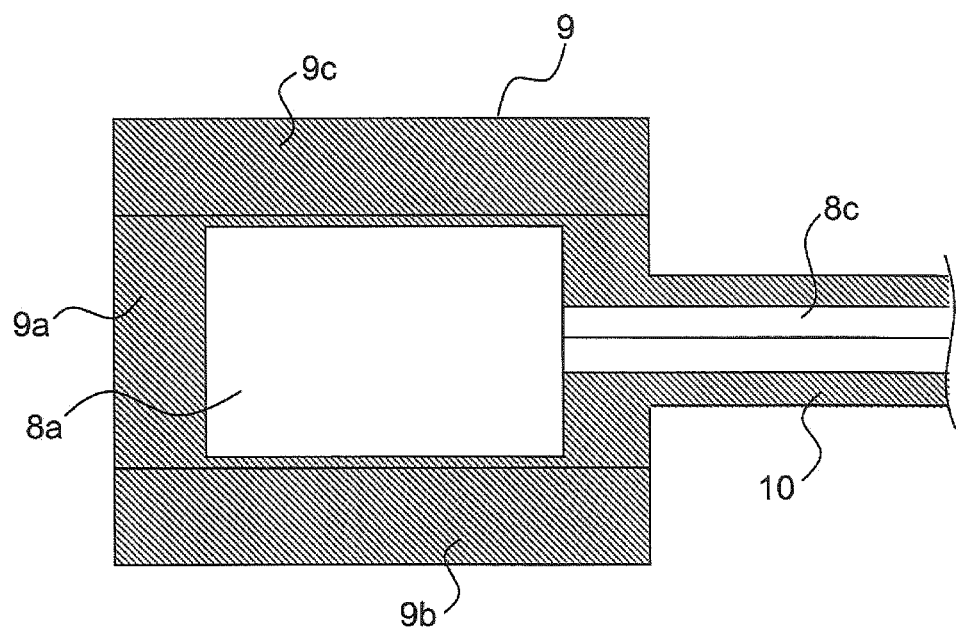
FIG. 9 is a plan view illustrating a state where a power cord 8 that is white in color is attached to a plug insertion recessed portion 9 and a cord housing portion 10 that are black in color.

When the plug insertion recessed portion 9 is formed of a glossy black resin as illustrated in FIG. 9, dust adhered inside the plug insertion recessed portion 9 becomes easy to be noticed, and this helps prevent the tracking phenomenon from being caused by accumulation of dust. When the cord housing groove 10 is also formed of a black resin, and the first plug portion 8a and the cord portion 8c of the power cord 8 are formed to be white in color, it is possible to check immediately whether or not the power cord 8 is attached.

Figure 10:
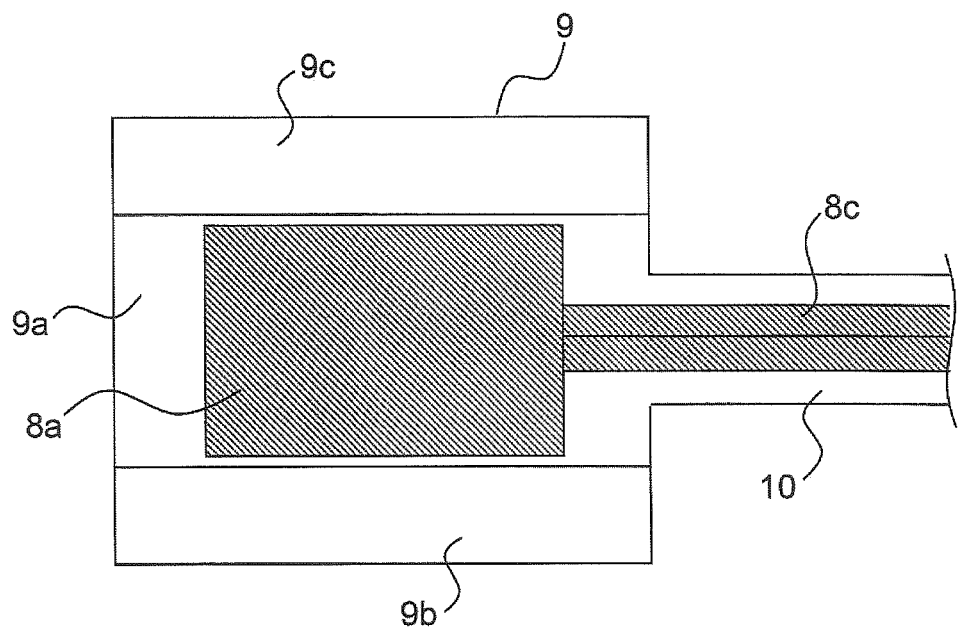
FIG. 10 is a plan view illustrating a state where a power cord 8 that is black in color is attached to a plug insertion recessed portion 9 and a cord housing portion 10 that are white in color.

Here, in a case where, as illustrated in FIG. 10, the plug insertion recessed portion 9 and the cord housing groove 10 are formed of a white resin and the first plug portion 8a and the cord portion 8c of the power cord 8 are formed to be black in color, too, the same effects and advantages as achieved in the case of FIG. 9 can be expected.

Figure 11:
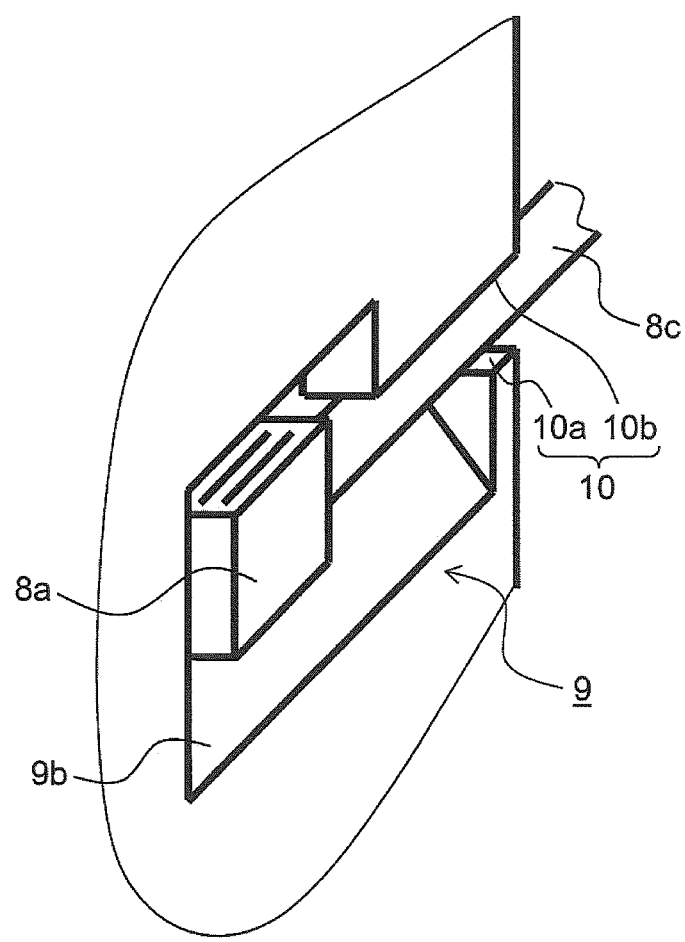
FIG. 11 is an enlarged perspective view of a plug insertion recessed portion 9 of an image forming apparatus 100 according to a second embodiment of the present invention.

FIG. 11 is an enlarged perspective view of a plug insertion recessed portion 9 of an image forming apparatus 100 according to a second embodiment of the present invention. Portions common to the first embodiment illustrated in FIG. 2 are denoted by the common reference signs, and overlapping descriptions thereof will be omitted. In the present embodiment, in contrast to in the first embodiment, the first slope 9b of the plug insertion recessed portion 9 is increased in length toward the cord accumulation groove 10. The cord housing groove 10 has a lower surface 10a that faces a lower part of the cord portion 8c, and an upper surface 10b that faces an upper part of the cord portion 8c. The lower surface 10a is smaller than the upper surface 10b in dimension in a direction in which the cord housing groove 10 extends.

According to the configuration of the present embodiment, it is possible to reduce an area of the lower surface 10a of the cord housing groove 10, and thus to reduce accumulation of dust on the lower surface 10a further effectively.

Figure 12:
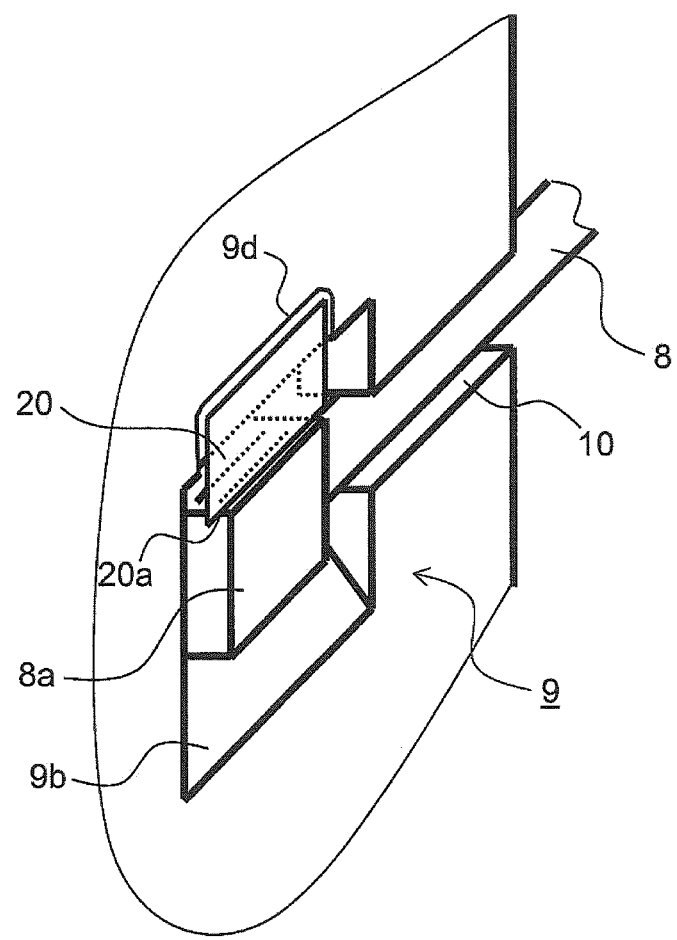
FIG. 12 is an enlarged perspective view of a plug insertion recessed portion 9 of an image forming apparatus 100 according to a third embodiment of the present invention.

FIG. 12 is an enlarged perspective view of a plug insertion recessed portion 9 of an image forming apparatus 100 according to a third embodiment of the present invention. Portions common to the first embodiment illustrated in FIG. 2 are denoted by the common reference signs, and overlapping descriptions thereof will be omitted. In the present embodiment, one side of a cover member 20, which is rectangular shaped, is fixed to a cover member fixing recessed portion 9d formed along the upper edge of the plug insertion recessed portion 9, such that a tip end part (a free end) 20a of the cover member 20 projects to an inner side of the plug insertion recessed portion 9.

The cover member 20 is formed of a flexible film of polyethylene terephthalate (PET), etc., and the tip end part 20a projects as close to the first plug portion 8a as possible without overlapping the first plug portion 8a. With this configuration, the cover member 20 prevents entry of dust into the space above the first plug portion 8a, and thus it is possible to effectively reduce accumulation of dust on the upper surface of the first plug portion 8a. Further, in attaching/detaching the first plug portion 8a, it is possible to insert a finger above the first plug portion 8a by pressing the tip end part 20a of the cover member 20 to warp the cover member 20.

It should be understood that the present invention is not limited to the above embodiments, and various modifications are possible within the scope of the present invention. For example, the dimension and the disposition of each member such as the power cord 8 and the plug insertion recessed portion 9 of each embodiment described above are merely an example, and can be modified as necessary in accordance with the specifications of the image forming apparatus 100.

In the above embodiments, descriptions have been given of the configurations for attaching a power cord, dealing with a digital MFP as illustrated in FIG. 1 as the image forming apparatus 100, but this is not meant as a limitation, and needless to say, the present invention is applicable to monochrome printers, color printers, color MFPs, and facsimile machines. Furthermore, the application of the present invention is not limited to image forming apparatuses, but the present invention is applicable also to electric apparatuses such as scanners, air purifiers, and personal computers.

INDUSTRIAL APPLICABILITY

The present invention is applicable to an attachment portion of a power cord for supplying power to an electric apparatus. Application of the present invention makes it possible to easily and securely attach a power cord to an apparatus main body, and also to provide an electric apparatus capable of reducing accumulation of dust.

The invention claimed is:

1. An electric apparatus comprising:
a power cord having a first plug portion configured to be detachably connected to an apparatus main body, a second plug portion configured to be detachably connected to an external power supply, and a cord portion that connects the first plug portion and the second plug portion to each other;
a plug insertion recessed portion that is disposed in a side surface of the apparatus main body, and to which an inlet to which the first plug portion is to be connected is attached; and
a cord housing groove that is formed to communicate with the plug insertion recessed portion, the cord housing groove having a depth that is equal to or larger than an outer diameter of the cord portion, and a width that is substantially equal to a width of the cord portion,
wherein
the plug insertion recessed portion includes:
an insertion surface that is formed at a position recessed inward from the side surface to be substantially parallel to the side surface, and to which the inlet is attached;
a first slope extending from a lower end part of the insertion surface toward a lower edge of the plug insertion recessed portion; and
a second slope extending from an upper end part of the insertion surface to an upper edge of the plug insertion recessed portion, and
in a state where the first plug portion has been inserted in the inlet, a distance a from a lower end part of the first plug portion to the lower edge of the plug insertion recessed portion and a distance b from an upper end part of the first plug portion to the upper edge of the plug insertion recessed portion satisfy a relationship of a>b.

2. The electric apparatus according to claim 1, wherein
a distance from a lower edge of the first slope to an upper edge of the second slope is equal to or larger than three times, but equal to or smaller than four times, of an up-down direction dimension of the first plug portion.

3. The electric apparatus according to claim 1, wherein
an up-down direction dimension of the insertion surface is equal to or larger than 1.2 times, but equal to or smaller than 1.5 times, of the up-down direction dimension of the first plug portion.

4. The electric apparatus according to claim 1, wherein
the distance a is equal to or larger than 1.1 times, but equal to or smaller than 1.4 times, of the up-down direction dimension of the first plug portion, and
the distance b is equal to or larger than 0.8 times of the up-down direction dimension of the first plug portion, but equal to or smaller than the up-down direction dimension of the first plug portion.

5. The electric apparatus according to claim 1, wherein
a distance from the insertion surface to the side surface is substantially equal to a width-direction dimension of the first plug portion.

6. The electric apparatus according to claim 5, wherein
the side surface in which the plug insertion recessed portion is formed is a plane substantially perpendicular to a placement surface on which the electric apparatus is placed.

7. The electric apparatus according to claim 1, wherein
the cord housing groove has a lower surface facing a lower part of the cord portion, and an upper surface facing an upper part of the cord portion, the lower surface being smaller than the upper surface in dimension in a direction in which the cord housing groove extends.

8. The electric apparatus according to claim 1, further comprising
a cover member that is flexible and fixed along the upper edge of the plug insertion recessed portion such that an end part of the cover member projects to a position in close proximity to an upper end of the first plug portion when the first plug portion is connected to the inlet.

9. The electric apparatus according to claim 1, wherein
the plug insertion recessed portion and the cord housing groove are black in color, and the power cord is white in color.

10. The electric apparatus according to claim 1, wherein
the plug insertion recessed portion and the cord housing groove are white in color, and the power cord is black in color.

11. The electric apparatus according to claim 1, wherein
an exhaust duct via which air inside the apparatus main body is discharged to outside is formed in a side surface that is different from the side surface in which the plug insertion recessed portion is formed.

\* \* \* \* \*